(12) United States Patent
Yang et al.

(10) Patent No.: US 11,357,098 B2
(45) Date of Patent: Jun. 7, 2022

(54) HIGH-SPEED SERIAL COMPUTER EXPANSION BUS CIRCUIT TOPOLOGY

(71) Applicants: INVENTEC (PUDONG) TECHNOLOGY CORPORATION, Shanghai (CN); INVENTEC CORPORATION, Taipei (TW)

(72) Inventors: Lei Yang, Shanghai (CN); Shuaifeng Zhu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 312 days.

(21) Appl. No.: 16/793,982

(22) Filed: Feb. 18, 2020

(65) Prior Publication Data
US 2021/0144845 A1 May 13, 2021

(30) Foreign Application Priority Data
Nov. 8, 2019 (CN) .......................... 201911089531.1

(51) Int. Cl.
*H05K 1/02* (2006.01)
*H05K 1/16* (2006.01)

(52) U.S. Cl.
CPC .......... *H05K 1/0237* (2013.01); *H05K 1/162* (2013.01); *H05K 1/167* (2013.01)

(58) Field of Classification Search
CPC ....... H05K 1/0237; H05K 1/162; H05K 1/167
USPC .......................................................... 327/316
See application file for complete search history.

(56) References Cited

U.S. PATENT DOCUMENTS

2020/0328492 A1* 10/2020 Park ........................ H01P 5/184

* cited by examiner

*Primary Examiner* — Tomi Skibinski
(74) *Attorney, Agent, or Firm* — Maschoff Brennan

(57) ABSTRACT

A high-speed serial computer expansion bus circuit topology, comprises: a first signal path connecting between a first interface and a second interface, a second signal path connecting between the first interface and a third interface, a third signal path connecting between the third interface and a fourth interface, a first selector circuit having a first passive element and a second passive element which are respectively disposed in the first signal path and the second signal path, a second selector circuit having a third passive element and a fourth passive element which are respectively disposed in the second signal path and the third signal path. The second signal path is conducted when the first passive element and the second passive element are conducted, the third signal path is conducted when the third passive element and the fourth passive element are conducted.

8 Claims, 5 Drawing Sheets

HIGH-SPEED SERIAL COMPUTER EXPANSION BUS CIRCUIT TOPOLOGY

CROSS-REFERENCE TO RELATED APPLICATIONS

This non-provisional application claims priority under 35 U.S.C. § 119(a) on Patent Application No(s). 201911089531.1 filed in China on Nov. 8, 2019, the entire contents of which are hereby incorporated by reference.

BACKGROUND

1. Technical Field

This disclosure relates to a circuit topology, specifically to a high-speed serial computer expansion bus standard circuit topology.

2. Related Art

PCIExpress (Peripheral Component Interconnect Express, PCIE) is a high-speed serial computer expansion bus standard, configured to replace the old PCI, PCI-X and AGP bus standard. PCIE belongs to high-speed serial end-to-end dual-channel high-frequency broadband transmission, the connecting devices allocate the bandwidth of the dedicated channel without sharing the bus bandwidth, which mainly support active power management, error report, end-to-end reliable transmission, hot swapping and quality of service (QOS). Compared to the traditional parallel bus structure, PCIE uses multiple pairs of high-speed serial buses for end-to-end connection, therefore providing high bus bandwidth. Meanwhile, due to the compatibility between the upper layer and PCIE, along with developed technology, it has become a standard interface in desktop computers, laptops, servers and other applications. In embedded applications that require high-speed data exchange, PCIE is one of the popular application standards. PCIE interface varies according to different bandwidth of buses, PCIE mostly uses multiple pairs of high-speed differential signals to transmit data.

PCIE is now developed to the third generation, generally known as PCIE Gen3, and the topology of its high-speed channel is a one-to-one structure. Branched channel will cause reflection, which will affect the quality of the signal. Therefore, when the PCIE channel needs multiplexing, a command method is to use a PCIE switching chip to solve the problem of insufficient PCIE channels. However, for the scheme of different allocation of PCIE channels for the same medial local bus (MLB) according to different system configurations, PCIE switching chips not only increase the cost, waste the space of printed circuit board, but also increase the power consumption of the system and a waste of use of the actual function of the chips.

SUMMARY

According to one or more embodiment of this disclosure, a high-speed serial computer expansion bus circuit topology, comprises: a first interface; a second interface; a third interface; a fourth interface; a first signal path, connected between the first interface and the second interface; a second signal path, connected between the first interface and the third interface; a third signal path, connected between the third interface and the fourth interface; a first selector circuit, having a first passive element and a second passive element, wherein the first passive element is disposed in the first signal path, the second passive element is disposed in the second signal path; and a second selector circuit, having a third passive element and a fourth passive element, wherein the third passive element is disposed in the second signal path, the fourth element is disposed in the third signal path, wherein, when a first terminal of the first passive element and a second terminal of a second passive element are conducted, the second signal path is conducted, when a first terminal of the third passive element and a second terminal of the fourth passive element are conducted, the third signal path is conducted.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

It should be noted that, the words "comprise" and "include" used in this specification are used to indicate the existence of specific technical features, values, method steps, operations, elements and/or components, but do not exclude adding more technical features, values, method steps, operation processing, elements, components, or any combination of the above.

Terms such as "first", "second", and "third" are used in the present disclosure to modify the elements or method steps in the claims, and are not used to indicate that these elements or method steps have priority order, antecedence or that one element precedes the other, or the chronological order in which method steps are performed, and is only used to distinguish elements with the same name.

Figure 1:
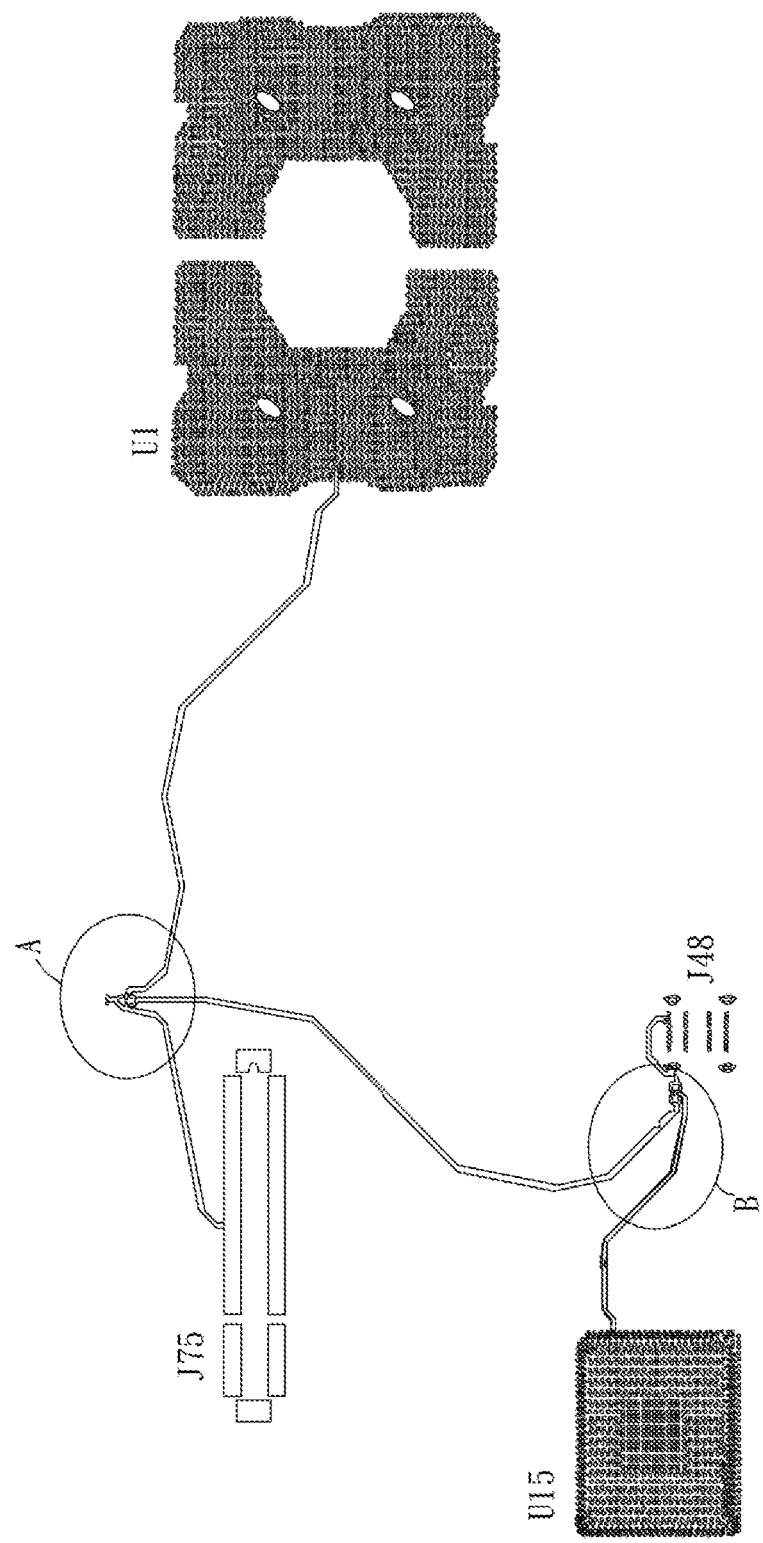
FIG. 1 is an embodiment of an application of a high-speed serial computer expansion bus circuit topology of the present disclosure.

FIG. 1 is an embodiment of an application of a high-speed serial computer expansion bus circuit topology of the present disclosure. As shown in FIG. 1, U1 interface is connected to a slot of a central processing unit, J75 interface is connected to a PCIE slot, and J48 interface is connected to a slot of a SATA (serial advanced technology attachment). The slots that are connected to the U1, J75 and J48 interfaces are the slots in the circled part A shown in FIG. 1. There are two applications of U15 interface, one is PCH and the other is SATA/PCIE. The slots that are connected to the U15 interfaces are the slots in the circled part B shown in FIG. 1. Therefore, two kinds of application can be applied to the same mainboard without the need for a PCIE switching chip. The processing of high-speed signals requires special layouts for the circuit, otherwise it will cause signal reflection. In view of this problem, the high-speed serial computer expansion bus circuit topology of the present disclosure uses the structure of capacitor superposition or resistor superposition, to solve the problem of signal reflection and at the same time, having better coupling of differential signals.

Figure 2:
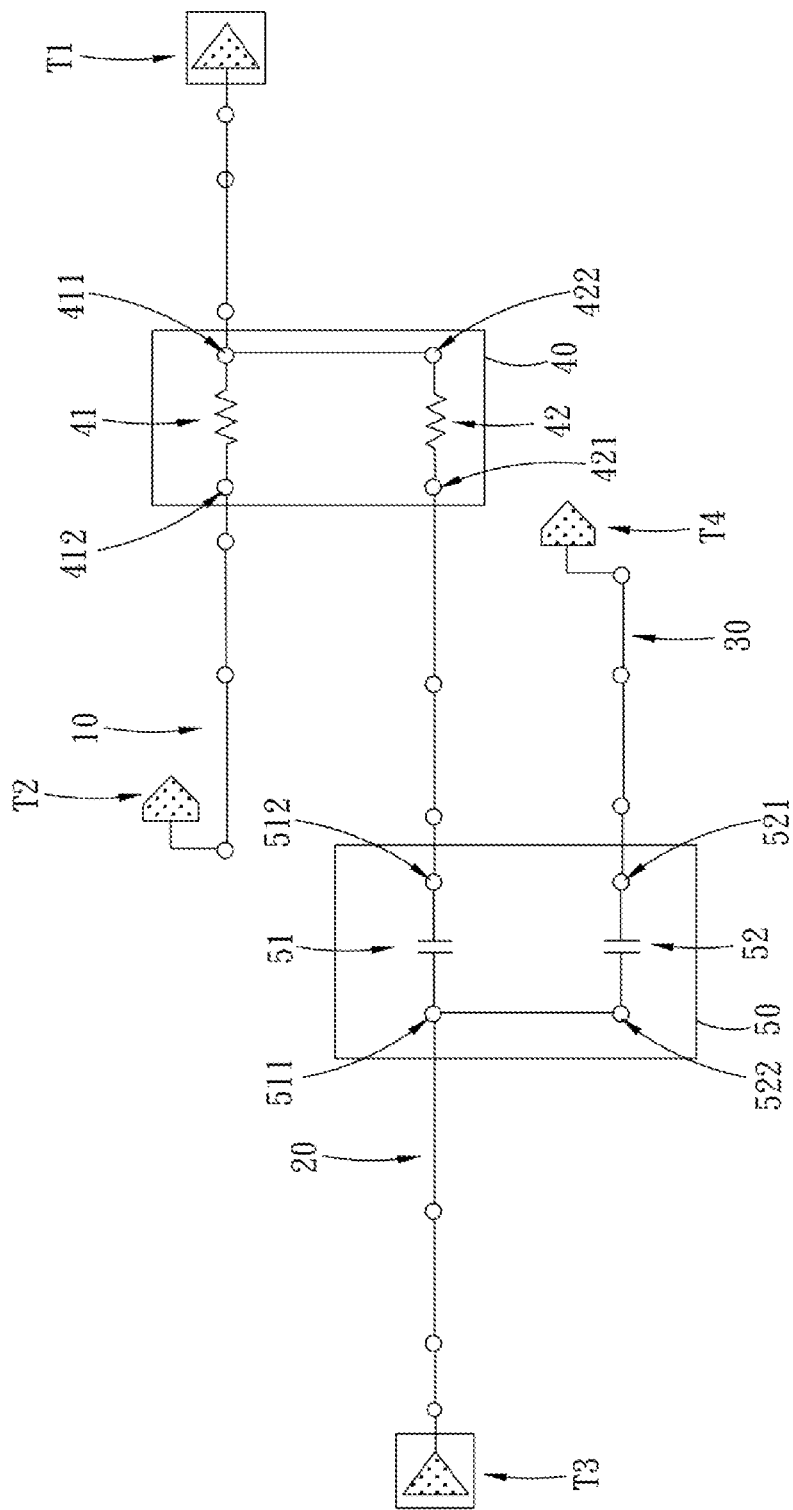
FIG. 2 is an embodiment of a high-speed serial computer expansion bus circuit topology of the present disclosure.

FIG. 2 is an embodiment of a high-speed serial computer expansion bus circuit topology of the present disclosure. As shown in the figure, the layout of the high-speed serial computer expansion bus circuit topology has a first signal path 10, a second signal path 20 and a third signal path 30. The first signal path 10 is connected between a first interface T1 and a second interface T2; the second signal path 20 is connected between the first interface T1 and a third interface T3; the third signal path 30 is connected between the third interface T3 and a fourth interface T4. In addition, a first selector circuit 40 and a second selector circuit 50 are provided. The first selector circuit 40 has a first passive element 41 and a second passive element 42, wherein the first passive element 41 is disposed in the first signal path 10, the first passive element 41 has a first terminal 411 and a second terminal 412. The second passive element 42 is disposed in the second signal path 20, the second passive element 42 has a first terminal 421 and a second terminal 422. The second selector circuit 50 has a third passive element 51 and a fourth passive element 52, wherein the third passive element 51 is disposed in the second signal path 20, the third passive element 51 has a first terminal 511 and a second terminal 512. The fourth passive element 52 is disposed in the third signal path 30, the fourth passive element 52 has a first terminal 521 and a second terminal 522. When the first terminal 411 of the first passive element 41 and the second terminal 422 of the second passive element 42 are conducted with each other, the second signal path 20 is conducted. When the first terminal 511 of the third passive element 51 and the second terminal 522 of the fourth passive element 52 are conducted with each other, the third signal path 30 is conducted.

In the circuit layout, the first signal path 10 and the first passive element 41 are located in an identical layer of the circuit board; the second signal path 20, the second passive element 42 and the third passive element 51 are located in an identical layer of the circuit board; the third signal path 30 and the fourth passive element 52 are located in an identical layer of the circuit board.

To be more specific, the passive elements of the first selector circuit 40 are resistors. For the convenience of description, the first passive element is defined as a first resistor, and the second passive element is defined as a second resistor. The passive elements in the second selector circuit 50 are capacitors. For the convenience of description, the third passive element is defined as a first capacitor, and the fourth passive element is defined as a second capacitor. The first selector circuit 40 has the first resistor and the second resistor, the second selector circuit 50 has the first capacitor and the second capacitor. The first resistor is disposed between the second interface (J75 interface) and the first interface (U1 interface), meaning it's disposed in the first signal path 10 between the J75 interface and the U1 interface. The first capacitor and the second resistor are disposed in the second signal path 20, the second capacitor is disposed in the third signal line 30. The first terminal of the first resistor is connected to the U1 interface side of the first signal path 10; the second terminal is connected to the J75 interface side of the first signal path 10. The first terminal of the second resistor is electrically connected to the second terminal of the first capacitor. The first terminal of the first capacitor is connected to the U15 interface side of the second signal path 20. The first terminal of the second capacitor is connected to the J48 interface side of the third signal path 30. The two terminals of the first signal path 10 is connected to the first interface and the second interface respectively. The first interface is the U1 interface as shown in the embodiment of FIG. 1; the second interface is the J75 interface as shown in the embodiment of FIG. 1. The first terminal of the second signal path is connected to the third interface; the first terminal of the third signal path is connected to the fourth interface. The third interface is the U15 interface shown in the embodiment of FIG. 1; the fourth interface is the J48 interface as shown in the embodiment of FIG. 1.

With two selector circuits, three sets of PCIE GEN3 channels can be realized, which respectively are U1 interface-first resistor-J75 interface, U15 interface-first capacitor-second resistor-U1 interface, U15 interface-second capacitor-J48 interface. It should be noted that, three sets of PCIE GEN3 channels don't actually exist at the same time, but rather selecting the U15 interface-first capacitor-second resistor-U1 interface channel or the U15 interface-second capacitor-J48 interface channel based on actual needs. When the first terminal of the first resistor and the second terminal of the second resistor are conducted with each other, the U15 interface-first capacitor-second resistor-U1 interface (second signal path 20) channel is conducted. When the first terminal of the first capacitor and the second terminal of the second capacitor are connected with each other, the U15 interface-second capacitor-J48 interface channel (third signal path 30) is conducted.

With the above description, the second terminal of the second resistor is selectively connected to the first terminal of the first resistor; the second terminal of the second capacitor is selectively connected to the first terminal of the first capacitor. Only two of the first signal path, the second signal path and the third signal path are conducted at the same time, meaning the first signal path and the second signal path, or the first signal path and the third signal path. In other words, when the second terminal of the second resistor is selectively connected to the first terminal of the first resistor, the first signal path and the second signal path are conducted to each other; when the second terminal of the second capacitor is selectively connected to the first terminal of the first capacitor, the first signal path and the third signal path are conducted to each other.

It should be noted that, since the first selector circuit uses two resistors, the second selector circuit selects two capacitors, stub will occur for two resistors or two capacitors during circuit layout. Therefore, when applying the high-speed serial computer expansion bus circuit topology to multilayer circuit board, the positions of through holes required special arrangement to avoid the stub between two capacitors or two resistors.

Figure 3:
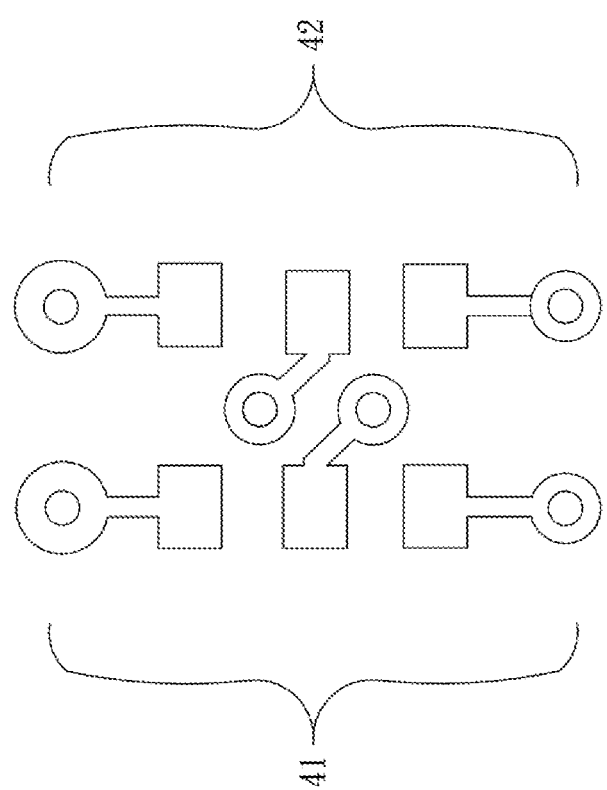
FIG. 3 is a schematic diagram of the resistor/capacitor layout of a high-speed serial computer expansion bus circuit topology of the present disclosure.

As shown in FIG. 3, which is a schematic diagram of the resistor/capacitor layout of a high-speed serial computer expansion bus circuit topology of the present disclosure. Due to the high-speed feature of the PCIE Gen3, if a bifurcation occurs on the layout channel, it will cause signal reflection and affect the quality of the signal. Therefore, the way to place and outlet the resistors and capacitors needs to be specially designed to avoid stubs, and minimize the length of uncoupled layout. Considering the three PCIE Gen3 channels described above are used in different system schemes, only one set of the capacitor/resistor is conducted in every two sets of the capacitor/resistor. Therefore, only one through hole of the capacitor/resistor needs to be opened, and a set of capacitor/resistor can be designed as overlapping to each other to a through hole with the design of the layout. Arranging the position of the through hole properly can avoid stub between two capacitors or resistors.

In other words, a through hole of the second terminal of the second passive element (the second resistor) and a through hole of the first terminal of the first passive element (the first resistor) are overlapped. A through hole of the second terminal of the fourth passive element (the second capacitor) and a through hole of the first terminal of the third passive element (the first capacitor) are overlapped. The capacitor/resistor layout design can use the same layout.

Figure 4:
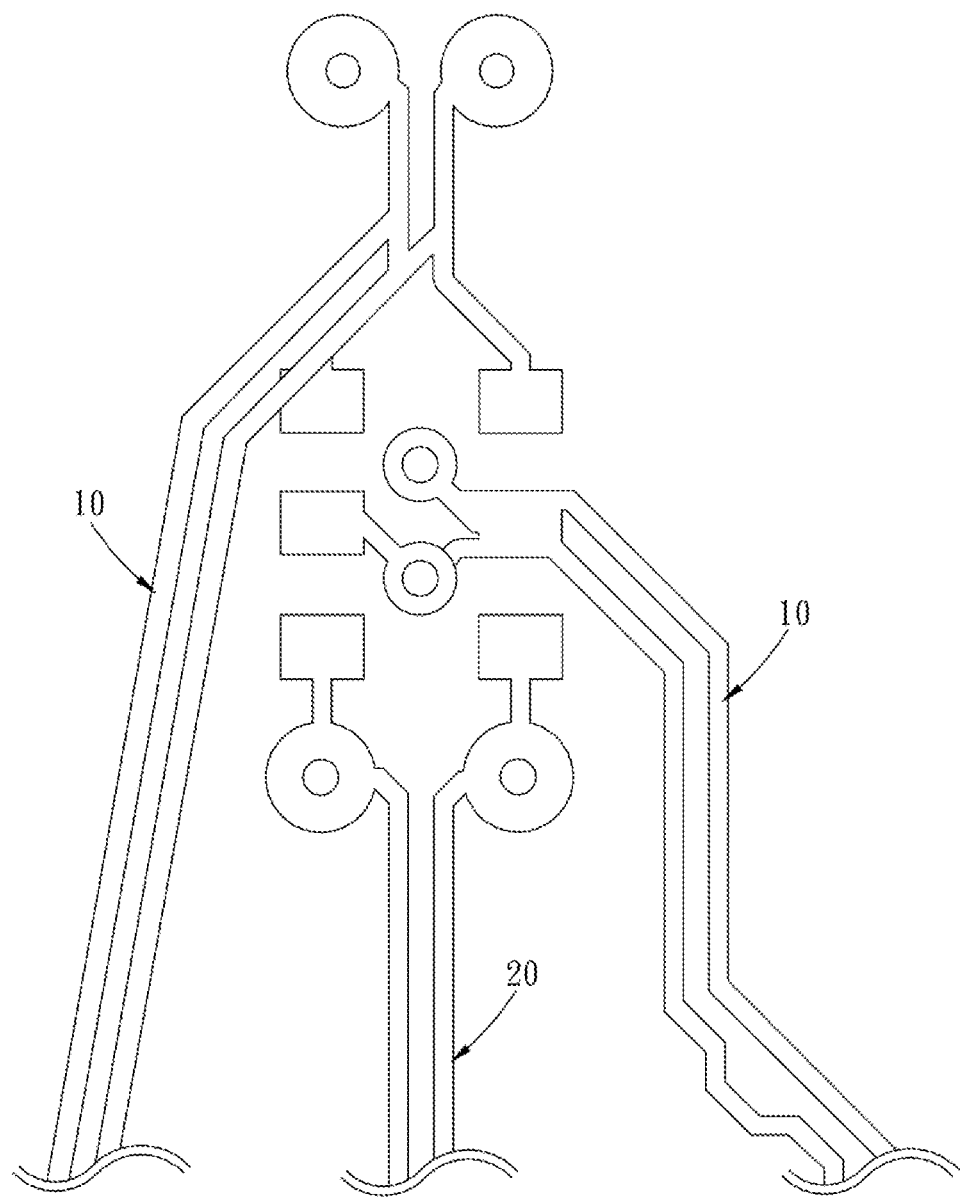
FIG. 4 is a schematic diagram to which the resistor/capacitor layout of FIG. 3 is applied.
Figure 5:
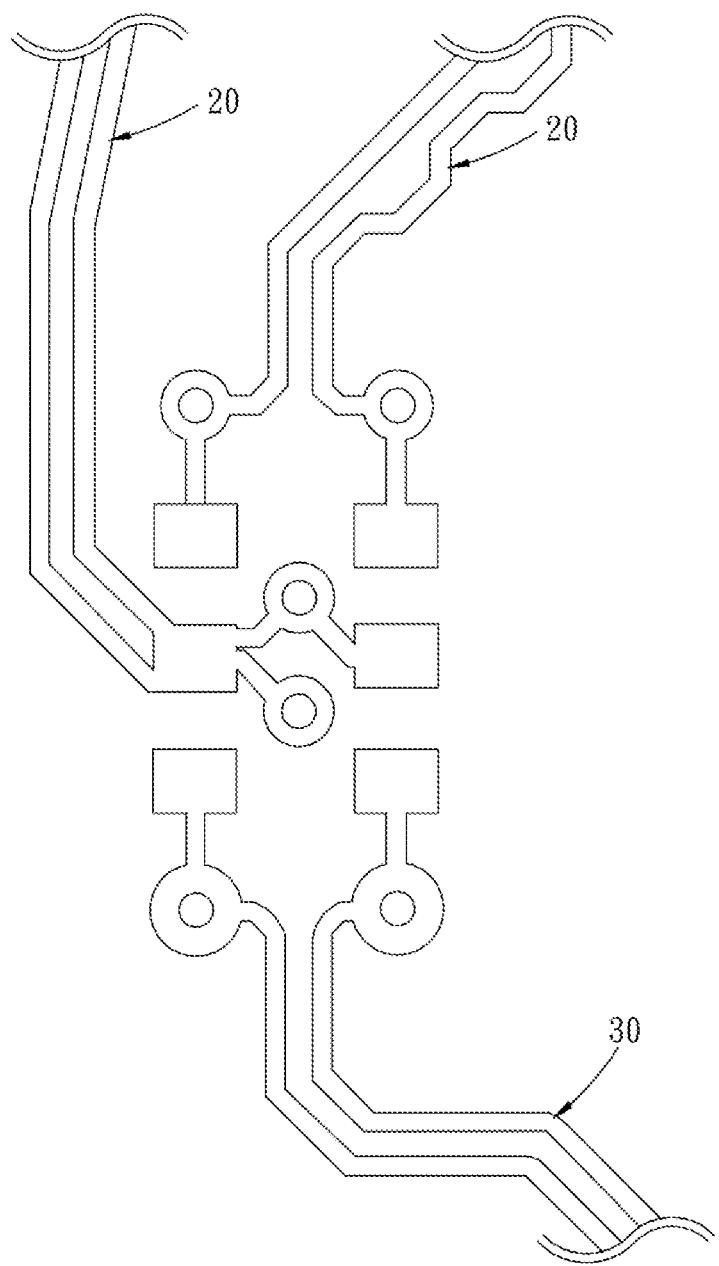
FIG. 5 is a schematic diagram to which the resistor/capacitor layout of FIG. 3 is applied.

FIGS. 4 and 5 are schematic diagrams to which the resistor/capacitor layout of FIG. 3 is applied. FIG. 4 is an enlarged view of part A in FIG. 1, which illustrates the layout of the first signal path and the second signal path. As shown in the figure, the through hole of the second terminal of the second resistor and the through hole of the first terminal of the first resistor are overlapped. FIG. 5 is an enlarged view of part B in FIG. 1, which illustrates the layout of the second signal path and the third signal path. As shown in the figure, the through hole of the second terminal of the second capacitor and the through hole of the first terminal of the first capacitor are overlapped.

The high-speed serial computer expansion bus circuit topology of the present disclosure adopts resistor to replace the PCIE switching chip. In addition, the layout of the topology is specially designed. The high-speed serial computer expansion bus circuit topology of the present disclosure has a simple structure, and since there is no need for the switching chip, the cost of the circuit is reduced. Besides, the specially designed circuit layout also saves the layout space. Finally, the power consumption is reduced due to the adoption of the passive element instead of the switching chip.

The present disclosure has been disclosed above in the embodiments described above, however it is not intended to limit the present disclosure. It is within the scope of the present disclosure to be modified without deviating from the essence and scope of it. It is intended that the scope of the present disclosure is defined by the following claims and their equivalents.

What is claimed is:

1. A high-speed serial computer expansion bus circuit topology, comprises:
a first interface;
a second interface;
a third interface;
a fourth interface;
a first signal path, connected between the first interface and the second interface;
a second signal path, connected between the first interface and the third interface;
a third signal path, connected between the third interface and the fourth interface;
a first selector circuit, having a first passive element and a second passive element, wherein the first passive element is disposed in the first signal path, the second passive element is disposed in the second signal path; and
a second selector circuit, having a third passive element and a fourth passive element, wherein the third passive element is disposed in the second signal path, the fourth element is disposed in the third signal path,
wherein, the second signal path is conducted when a first terminal of the first passive element and a second terminal of the second passive element are conducted, the third signal path is conducted when a first terminal of the third passive element and a second terminal of the fourth passive element are conducted.

2. The high-speed serial computer expansion bus circuit topology according to claim 1, wherein the first passive element is a resistor and the second passive element is a resistor.

3. The high-speed serial computer expansion bus circuit topology according to claim 1, wherein the third passive element is a capacitor and the fourth passive element is a capacitor.

4. The high-speed serial computer expansion bus circuit topology according to claim 1, wherein the first signal path and the first passive element are located in an identical layer of a circuit board.

5. The high-speed serial computer expansion bus circuit topology according to claim 1, wherein the second signal path, the second passive element and the third passive element are located in an identical layer of a circuit board.

6. The high-speed serial computer expansion bus circuit topology according to claim 1, wherein the third signal path and the fourth passive element are located in an identical layer of a circuit board.

7. The high-speed serial computer expansion bus circuit topology according to claim 1, wherein a through hole of the second terminal of the second passive element and a through hole of the first terminal of the first passive element are disposed overlapping each other.

8. The high-speed serial computer expansion bus circuit topology according to claim 1, wherein a through hole of the second terminal of the fourth passive element and a through hole of the first terminal of the third passive element are disposed overlapping each other.

* * * * *